US007344970B2

(12) United States Patent  
Forman et al.

(10) Patent No.: US 7,344,970 B2
(45) Date of Patent: Mar. 18, 2008

(54) PLATING METHOD

(75) Inventors: Robert S. Forman, Gig Harbor, WA (US); Jill E. Steeper, Melrose, MA (US); Eric C. Huenger, Seaford, NY (US)

(73) Assignee: Shipley Company, L.L.C., Marlborough, MA (US)

( * ) Notice: Subject to any disclaimer, the term of this patent is extended or adjusted under 35 U.S.C. 154(b) by 819 days.

(21) Appl. No.: 10/408,428

(22) Filed: Apr. 7, 2003

(65) Prior Publication Data

US 2004/0018724 A1 Jan. 29, 2004

Related U.S. Application Data

(60) Provisional application No. 60/371,873, filed on Apr. 11, 2002.

(51) Int. Cl.
*H01L 21/44* (2006.01)

(52) U.S. Cl. ........................................ 438/613; 430/315

(58) Field of Classification Search ................ 438/597, 438/612, 613; 430/315
See application file for complete search history.

(56) References Cited

U.S. PATENT DOCUMENTS

| | | | |
|---|---|---|---|
| 4,592,816 A | 6/1986 | Emmons et al. | |
| 4,629,680 A | 12/1986 | Iwasaki et al. | |
| 4,794,021 A | 12/1988 | Potter | |
| 5,055,164 A | 10/1991 | Hawkins et al. | |
| 5,202,222 A | 4/1993 | Harris et al. | |
| 5,965,328 A * | 10/1999 | Sano et al. | 430/315 |
| 6,110,643 A | 8/2000 | Rath et al. | |
| 2004/0063025 A1 | 4/2004 | Natori et al. | |

FOREIGN PATENT DOCUMENTS

| | | |
|---|---|---|
| EP | 0 223 114 A2 | 5/1987 |
| EP | 0 529 643 A1 | 3/1993 |
| EP | 0 855 620 | 7/1998 |
| EP | 1 148 548 | 10/2001 |
| KR | 10-2001-0027380 | 4/2001 |

OTHER PUBLICATIONS

Lehar et al., "Solvent Content of Thick Photoresist Films", Proceedings of SPIE, vol. 3999 (2000), pp. 442-451.
Pham et al., "IC-compatible process for pattern transfer in deep wells for integration of RF components", In Micromachining and Microfabrication Process Technology VI, Jean-Michel Karam, John Yasaitis, Editors, Proceedings of SPIE, vol. 4174 (2000), pp. 390-397.
Oberlander et al., "Development of an Edge Bead Remover (EBR) for Thick Films", Advances in Resist Technology and Processing XVIII, Francis M. Houlihan, Editor, Proceedings of SPIE vol. 4345 (2001), pp. 475-483.
Lehar et al., "Resist Re-Hydration During Thick Film Processing", Advances in Resist Technology and Processing XVIII, Francis M. Houlhan, Editor, Proceedings of SPIE vol. 4345 (2001), pp. 463-474.
Clifford Hamel, Karl Suss America, Inc., Waterbury Center, VT, pp. 1-12.

* cited by examiner

*Primary Examiner*—Bradley K. Smith
(74) *Attorney, Agent, or Firm*—Jonathan D. Baskin

(57) ABSTRACT

Photoresist compositions and methods suitable for depositing a very thick photoresist layer in a single coating process are provided. Such photoresist layers are particularly suitable for use in chip scale packaging.

20 Claims, No Drawings

PLATING METHOD

This application claims the benefit of Provision application Ser. No. 60/371,873, filed Apr. 11, 2002.

BACKGROUND OF THE INVENTION

The present invention relates generally to the field of metal plating. In particular, the present invention relates to the field of plating metal bumps, such as solder bumps, on electronic devices.

Thick photoresist layers, e.g. from 5-10 µm up to 50-100 µm, are used in certain electronic device manufacturing processes. For example, thick photoresist layers are used in high volume applications for micro electro mechanical systems ("MEMS"), in the fabrication of molds for metal deposition in chip scale packaging, solder paste printing, TAB wire bonding and the like. In particular, thick photoresist layers are useful in the formation of large mechanical structures such as solder bumps on semiconductor wafers.

In such processes, a substrate is coated multiple times with sufficient photoresist to provide a thick photoresist layer. Such thick photoresist layers are then imaged according to conventional procedures to provide the desired features or patterns. The imaged layers are then developed using the appropriate procedures for the particular photoresist employed. Following development, metal such as copper, tin, lead, gold or a mixture of any of these is deposited into the features. After metal deposition, the thick photoresist is removed and the metal deposit may optionally be reflowed to provide a somewhat spherical shape for chip scale packaging.

In such conventional processes, thick photoresist layers are achieved by using multiple layers of conventional photoresists. Conventional photoresists provide a photoresist layer having a thickness of about 1-10 µm. Many such coating steps are required to build up a photoresist layer of 15-100 µm. Each step adds to the time and monetary cost of the process and the resulting electronic devices. There is accordingly a need for a method of applying a thick photoresist layer in a single step.

U.S. Pat. No. 4,592,816 (Emmons et al.) discloses compositions and a process for the electrophoretic deposition of a photoresist. The photoresists of this patent are aqueous based and contain a (meth)acrylate binder polymer having positively or negatively charged groups, and a cross-linking agent. Very thick photoresist layers, i.e. $\geq 50$ µm, are not disclosed in this patent.

Certain non-aqueous liquid photoresists are commercially available that contain a (meth)acrylate binder polymer having non-charged amino groups, an acrylate cross-linking agent, and a photoactive component. Such photoresists have a total solids content of less than 35%. Thick photoresist layers cannot be made in a single coating procedure using these commercially available photoresists.

Korean Patent Application No. 10-1999-0039084, to Samsung Electronics Co., discloses a method for applying a photoresist to a semiconductor wafer. The photoresist layer has a thickness of up to about 35,000 Å (or 3.5 µm). This is achieved by spraying the photoresist on the wafer, rotating the wafer at a relatively low speed and a low acceleration rate to harden the photoresist, and then rotating the wafer at a high rotation speed and a high acceleration rate to provide the photoresist layer having the desired thickness and uniformity. Very thick photoresists are not disclosed in this patent application.

SUMMARY OF THE INVENTION

It has been surprisingly found that very thick photoresist layers can be applied to a substrate, such as a semiconductor wafer, in a single coating step. Such photoresist layers have very good thickness uniformity.

In one aspect, the present invention provides a method for depositing a photosensitive composition including the steps of: a) disposing on an electronic device substrate a photosensitive composition including a binder polymer; one or more cross-linking agents; one or more photoactive components; and an organic solvent; wherein the photosensitive composition has an absorbance of $\leq 0.1$ absorbance units per micron at 365 nm; wherein the photosensitive composition is substantially free of water and wherein the photosensitive composition has a total solids content of 45% or greater; and b) spinning the electronic device substrate at a speed and for a time sufficient to provide a layer of the photosensitive composition having a substantially uniform thickness, wherein the thickness of the layer is 50 µm or greater.

In another aspect, the present invention provides a method for depositing a photosensitive composition including the steps of: a) disposing on an electronic device substrate a photosensitive composition including a binder polymer including as polymerized units one or more (meth)acrylate monomers; one or more free-radically polymerizable cross-linking agents; one or more photoactive components; and an organic solvent; wherein the photosensitive composition is substantially free of water and wherein the photosensitive composition has a total solids content of 45% or greater; and b) spinning the electronic device substrate at a speed and for a time sufficient to provide a layer of the photosensitive composition having a substantially uniform thickness, wherein the thickness of the layer is 50 µm or greater.

In a further aspect, the present invention provides a method for forming a relief image on a semiconductor wafer including the steps of: a) disposing on a semiconductor wafer a photosensitive composition including a binder polymer including as polymerized units one or more (meth)acrylate monomers; one or more free-radically polymerizable cross-linking agents; one or more photoactive components; and an organic solvent; wherein the photosensitive composition is substantially free of water and wherein the photosensitive composition has a total solids content of 45% or greater; b) spinning the semiconductor wafer at a speed and for a time sufficient to provide a layer of the photosensitive composition having a substantially uniform thickness, wherein the thickness of the layer is 50 µm or greater; and c) imagewise exposing the layer of photosensitive composition to actinic radiation.

In yet another aspect, the present invention provides a method for forming metal bumps on a semiconductor wafer including the steps of: a) disposing on a semiconductor wafer a photosensitive composition including a binder polymer including as polymerized units one or more (meth)acrylate monomers; one or more free-radically polymerizable cross-linking agents; one or more photoactive components; and an organic solvent; wherein the photosensitive composition is substantially free of water and wherein the photosensitive composition has a total solids content of 45% or greater; b) spinning the semiconductor wafer at a speed and for a time sufficient to provide a layer of the photosensitive composition having a substantially uniform thickness, wherein the thickness of the layer is 50 µm or greater; c) imagewise exposing the layer of photosensitive composition to actinic radiation; d) developing the exposed layer of photosensitive composition to provide patterned areas; e) depositing a metal into the patterned areas; and f) removing the exposed photosensitive composition to provide a semiconductor wafer having metal bumps.

DETAILED DESCRIPTION OF THE INVENTION

As used throughout this specification, the following abbreviations shall have the following meanings, unless the context clearly indicates otherwise: ° C.=degrees Centigrade; g=grams; mJ=millijoules; rpm=revolutions per minute; sec.=second; min.=minute; μm=micron=micrometer; and % wt=percent by weight.

The terms "resin" and "polymer" are used interchangeably throughout this specification. The term "alkyl" refers to linear, branched and cyclic alkyl. The terms "halogen" and "halo" include fluorine, chlorine, bromine, and iodine. Thus the term "halogenated" refers to fluorinated, chlorinated, brominated, and iodinated. "Polymers" refer to both homopolymers and copolymers and include dimers, trimers, oligomers and the like. The term "(meth)acrylate" refers to both acrylate and methacrylate. Likewise, the term "(meth) acrylic" refers to both acrylic and methacrylic. "Monomer" refers to any ethylenically or acetylenically unsaturated compound capable of being polymerized. The terms "crosslinker" and "cross-linking agent" are used interchangeably throughout this specification and refer to compounds that contain two or more sites of ethylenic or acetylenic unsaturation. The terms "thick photoresist" or "thick photoresist layer" are used throughout this specification to refer to a photoresist layer having a thickness of $\geq 5$ μm. "Very thick photoresist" and "very thick photoresist layers" refer to a photoresist layer having a thickness of $\geq 50$ μm.

All amounts are percent by weight and all ratios are by weight, unless otherwise noted. All numerical ranges are inclusive and combinable in any order, except where it is obvious that such numerical ranges are constrained to add up to 100%.

Very thick film photoresists can be deposited on an electronic device substrate according to the present invention including the steps of: a) disposing on an electronic device substrate a photosensitive composition including a binder polymer; one or more cross-linking agents; one or more photoactive components; and an organic solvent; wherein the photosensitive composition has an absorbance of $\leq 0.1$ absorbance units per micron at 365 nm; wherein the photosensitive composition is substantially free of water and wherein the photosensitive composition has a total solids content of 45% or greater; and b) spinning the electronic device substrate at a speed and for a time sufficient to provide a layer of the photosensitive composition having a substantially uniform thickness, wherein the thickness of the layer is 50 μm or greater.

The present invention is achieved using a photosensitive composition having an absorbance of $\leq 0.1$ absorbance units per micron of thickness at 365 nm. Preferably, the photosensitive composition has an absorbance of $\leq 0.05$ absorbance units per micron of thickness at 365 nm. A wide variety of photosensitive compositions having such absorbance per unit thickness may suitably be used. Particularly suitable photosensitive compositions are those containing a binder polymer including as polymerized units one or more (meth)acrylate monomers and containing one or more free-radically polymerizable cross-linking agents; one or more photoactive components; and an organic solvent. Such photosensitive compositions may be either positive-acting or negative-acting. Such photosensitive compositions are well-known to those skilled in the art.

In a preferred embodiment, the present invention provides a method for depositing a photosensitive composition including the steps of: a) disposing on an electronic device substrate a photosensitive composition including a binder polymer including as polymerized units one or more (meth)acrylate monomers; one or more free-radically polymerizable cross-linking agents; one or more photoactive components; and an organic solvent; wherein the photosensitive composition is substantially free of water and wherein the photosensitive composition has a total solids content of 45% or greater; and b) spinning the electronic device substrate at a speed and for a time sufficient to provide a layer of the photosensitive composition having a substantially uniform thickness, wherein the thickness of the layer is 50 μm or greater. By "substantially uniform thickness" it is meant that the thickness variation over the surface of the substrate is ±10%, preferably ±8%, and more preferably ±5% of the mean thickness.

Particularly suitable binder polymers are those including as polymerized units one or more (meth)acrylate monomers. Such binder polymers may include one or more other monomers as polymerized units. (Meth)acrylate monomers include alkyl (meth)acrylates, alkenyl (meth)acrylates, aromatic (meth)acrylates, (meth)acrylamides and alkyl (meth) acrylamides. Suitable other monomers for use in the binder polymer include, but are not limited to, (meth)acrylic acid, vinyl aromatic monomers, nitrogen-containing compounds and their thio-analogs, substituted ethylene monomers, cyclic olefins, substituted cyclic olefins, and the like. Preferably, the binder polymer includes as polymerized units one or more acid developable group-containing monomers. Preferred monomers containing acid developable groups are amine-containing or amide-containing monomers and preferably one or more amine-containing (meth)acrylate monomers. Particularly suitable amine-containing monomers include, but are not limited to, 2-(dimethylamino)ethyl methacrylate ("DMAEMA"), 3-(dimethylamino)propyl methacrylamide ("DMAPMA"), or dimethylaminoethyl acrylate. Other useful amine-containing monomers include, but are not limited to, those containing a dialkylamino group or dialkylaminoalkyl group in the alkyl radical, such as N,N-dimethylaminoethyl methacrylamide, N,N-dimethylaminopropyl methacrylamide, N,N-dimethylaminobutyl methacrylamide, N,N-di-ethylaminoethyl methacrylamide, N,N-diethylaminopropyl methacrylamide, N,N-diethylaminobutyl methacrylamide, N-(1,1-dimethyl-3-oxobutyl) acrylamide, N-(1,3-diphenyl-1-ethyl-3-oxobutyl) acrylamide, N-(1-methyl-1-phenyl-3-oxobutyl) methacrylamide, and 2-hydroxyethyl acrylamide, N-methacrylamide of aminoethyl ethylene urea, N-methacryloxy ethyl morpholine, N-maleimide of dimethylaminopropylamine and mixtures thereof.

Typically, the alkyl (meth)acrylates useful in the present invention are $(C_1-C_{24})$alkyl (meth)acrylates. Suitable alkyl (meth)acrylates include, but are not limited to, "low cut" alkyl (meth)acrylates, "mid cut" alkyl (meth)acrylates and "high cut" alkyl (meth)acrylates.

"Low cut" alkyl (meth)acrylates are typically those where the alkyl group contains from 1 to 6 carbon atoms. Suitable low cut alkyl (meth)acrylates include, but are not limited to: methyl methacrylate, methyl acrylate, ethyl acrylate, propyl methacrylate, butyl methacrylate, butyl acrylate, isobutyl methacrylate, hexyl methacrylate, cyclohexyl methacrylate, cyclohexyl acrylate and mixtures thereof.

"Mid cut" alkyl (meth)acrylates are typically those where the alkyl group contains from 7 to 15 carbon atoms. Suitable mid cut alkyl (meth)acrylates include, but are not limited to: 2-ethylhexyl acrylate ("EHA"), 2-ethylhexyl methacrylate, octyl methacrylate, decyl methacrylate, isodecyl methacrylate (based on branched ($C_{10}$)alkyl isomer mixture), undecyl methacrylate, dodecyl methacrylate (also known as lauryl methacrylate), tridecyl methacrylate, tetradecyl methacrylate (also known as myristyl methacrylate), pentadecyl methacrylate and mixtures thereof.

"High cut" alkyl (meth)acrylates are typically those where the alkyl group contains from 16 to 24 carbon atoms. Suitable high cut alkyl (meth)acrylates include, but are not limited to: hexadecyl methacrylate, heptadecyl methacrylate, octadecyl methacrylate, nonadecyl methacrylate, cosyl methacrylate, eicosyl methacrylate and mixtures thereof.

The mid-cut and high-cut alkyl (meth)acrylate monomers described above are generally prepared by standard esterification procedures using technical grades of long chain aliphatic alcohols, and these commercially available alcohols are mixtures of alcohols of varying chain lengths containing between 10 and 15 or 16 and 20 carbon atoms in the alkyl group. Examples of these alcohols are the various Ziegler catalyzed ALFOL alcohols from Vista Chemical company, i.e., ALFOL 1618 and ALFOL 1620, Ziegler catalyzed various NEODOL alcohols from Shell Chemical Company, i.e. NEODOL 25L, and naturally derived alcohols such as Proctor & Gamble's TA-1618 and CO-1270. Consequently, for the purposes of this invention, alkyl (meth)acrylate is intended to include not only the individual alkyl (meth)acrylate product named, but also to include mixtures of the alkyl (meth)acrylates with a predominant amount of the particular alkyl (meth)acrylate named.

The alkyl (meth)acrylate monomers useful in the present invention may be a single monomer or a mixture having different numbers of carbon atoms in the alkyl portion. Also, the (meth)acrylamide and alkyl (meth)acrylate monomers useful in the present invention may optionally be substituted. Suitable optionally substituted (meth)acrylamide and alkyl (meth)acrylate monomers include, but are not limited to: hydroxy($C_2$-$C_6$)alkyl (meth)acrylates, dialkylamino($C_2$-$C_6$)-alkyl (meth)acrylates, dialkylamino($C_2$-$C_6$)alkyl (meth) acrylamides.

Suitable hydroxyalkyl (meth)acrylate monomers include, but are not limited to: 2-hydroxyethyl methacrylate ("HEMA"), 2-hydroxyethyl acrylate ("HEA"), 2-hydroxypropyl methacrylate, 1-methyl-2-hydroxyethyl methacrylate, 2-hydroxy-propyl acrylate, 1-methyl-2-hydroxyethyl acrylate, 2-hydroxybutyl methacrylate, 2-hydroxybutyl acrylate and mixtures thereof.

Other substituted (meth)acrylate monomers useful in the present invention are silicon-containing monomers such as γ-propyl tri($C_1$-$C_6$)alkoxysilyl (meth)acrylate, γ-propyl tri ($C_1$-$C_6$)alkylsilyl (meth)acrylate, γ-propyl di($C_1$-$C_6$)alkoxy ($C_1$-$C_6$)alkylsilyl (meth)acrylate, γ-propyl di($C_1$-$C_6$)alkyl ($C_1$-$C_6$)alkoxysilyl (meth)acrylate, vinyl tri($C_1$-$C_6$) alkoxysilyl (meth)acrylate, vinyl di($C_1$-$C_6$)alkoxy($C_1$-$C_6$) alkylsilyl (meth)acrylate, vinyl ($C_1$-$C_6$)alkoxydi($C_1$-$C_6$) alkylsilyl (meth)acrylate, vinyl tri($C_1$-$C_6$)alkylsilyl (meth) acrylate, 2-propylsilsesquioxane (meth)acrylate and mixtures thereof.

The vinyl aromatic monomers useful as unsaturated monomers in the present invention include, but are not limited to: styrene, hydroxystyrene, (x-methylstyrene, vinyltoluene, p-methylstyrene, ethylvinylbenzene, vinylnaphthalene, vinylxylenes, and mixtures thereof. The vinylaromatic monomers also include their corresponding substituted counterparts, such as halogenated derivatives, i.e., containing one or more halogen groups, such as fluorine, chlorine or bromine; and nitro, cyano, ($C_1$-$C_{10}$)alkoxy, halo($C_1$-$C_{10}$) alkyl, carb($C_1$-$C_{10}$)alkoxy, carboxy, amino, ($C_1$-$C_{10}$)alkylamino derivatives and the like.

The nitrogen-containing compounds and their thio-analogs useful as unsaturated monomers in the present invention include, but are not limited to: vinylpyridines such as 2-vinylpyridine or 4-vinylpyridine; ($C_1$-$C_8$)alkyl substituted N-vinyl pyridines such as 2-methyl-5-vinyl-pyridine, 2-ethyl-5-vinylpyridine, 3-methyl-5-vinylpyridine, 2,3-dimethyl-5-vinyl-pyridine, and 2-methyl-3-ethyl-5-vinylpyridine; methyl-substituted quinolines and isoquinolines; N-vinylcaprolactam; N-vinylbutyrolactam; N-vinylpyrrolidone; vinyl imidazole; N-vinyl carbazole; N-vinyl-succinimide; (meth)acrylonitrile; o-, m-, or p-aminostyrene; maleimide; N-vinyl-oxazolidone; N,N-dimethyl aminoethyl-vinyl-ether; ethyl-2-cyano acrylate; vinyl acetonitrile; N-vinylphthalimide; N-vinyl-pyrrolidones such as N-vinyl-thio-pyrrolidone, 3 methyl-1-vinyl-pyrrolidone, 4-methyl-1-vinyl-pyrrolidone, 5-methyl-1-vinyl-pyrrolidone, 3-ethyl-1-vinyl-pyrrolidone, 3 -butyl-1-vinyl-pyrrolidone, 3,3-dimethyl- 1-vinyl-pyrrolidone, 4,5-dimethyl-1-vinyl-pyrrolidone, 5,5-dimethyl-1-vinyl-pyrrolidone, 3,3,5-trimethyl-1-vinyl-pyrrolidone, 4-ethyl-1-vinyl-pyrrolidone, 5-methyl-5-ethyl-1-vinyl-pyrrolidone and 3,4,5-trimethyl-1-vinyl-pyrrolidone; vinyl pyrroles; vinyl anilines; and vinyl piperidines.

The substituted ethylene monomers useful as unsaturated monomers is in the present invention include, but are not limited to: vinyl acetate, vinyl formamide, vinyl chloride, vinyl fluoride, vinyl bromide, vinylidene chloride, vinylidene fluoride, vinylidene bromide, tetrafluoroethylene, trifluoroethylene, trifluoromethyl vinyl acetate and vinyl ethers.

Preferably, the present binder polymers include as polymerized units one or more amine-containing (meth)acrylate monomers and one or more low-cut (meth)acrylate monomers.

The (meth)acrylate binder polymers are generally commercially available such as from the Rohm and Haas Company, Philadelphia, Pa., or may be prepared by any known means such as emulsion, solution or suspension polymerization. The emulsion polymers useful in the present invention are generally prepared by first charging water and some portion of the monomer emulsion to a reaction vessel equipped with a stirrer, a thermometer and a reflux condenser. Typically, the monomer emulsion is composed of monomer, surfactant, initiator and chain transfer agent, as appropriate. The initial charge of monomer emulsion is heated with stirring under a nitrogen blanket to a temperature of from about 55° C. to about 125° C. After the seed charge has reached a temperature sufficient to initiate polymerization, the monomer emulsion or balance of the monomer emulsion is charged to the reaction vessel over a period of 15 minutes to 4 hours while maintaining the reaction at the desired reaction temperature. After completing the monomer emulsion addition, a series of additional aliquots of initiator in water are charged to the reaction. Typically the initiator is charged to the reaction and followed by a hold period to allow for reaction to occur before adding the next initiator amount. Typically three initiator additions are used. After the final initiator amount is added, the batch is held for 30 minutes to 4 hours to fully decompose all initiator and drive the reaction to completeness.

In the alternative, the emulsion polymerization may be carried out in a batch process. In such a batch process, the emulsion polymers are prepared by charging water, monomer, surfactant, initiator and chain transfer agent, as appropriate, to a reaction vessel with stirring under a nitrogen blanket. The monomer emulsion is heated to a temperature of from about 55° C. to about 125° C. to carry out the polymerization. After 30 minutes to 4 hours at this temperature, a series of additional aliquots of initiator are charged to the reaction vessel. Typically the initiator is charged to the reaction vessel followed by a hold period to allow for reaction to occur before adding the next amount of initiator. Typically three initiator additions are used. After the final initiator amount is added, the batch is held for 30 minutes to 4 hours to fully decompose all initiator and drive the reaction to completeness.

After polymerization, the emulsion polymers may be isolated and then taken up in any suitable organic solvent. Such methods are well known to those skilled in the art.

The solution polymers of the present invention are generally prepared by first charging a solvent heel or alternatively a mixture of solvent and some portion of the monomer mixture to a reaction vessel equipped with a stirrer, a thermometer and a reflux condenser. The monomer mixture is typically composed of monomer, initiator and chain transfer agent, as appropriate. The solvent or solvent/monomer mixture heel is heated with stirring under a nitrogen blanket to a temperature from about 55° C. to about 125° C. After the heel charge has reached a temperature sufficient to initiate polymerization, the monomer mixture or balance of the monomer mixture is charged to the reaction vessel over a period of 15 minutes to 4 hours while maintaining the reaction at the desired reaction temperature. After completing the monomer mixture addition, a series of additional aliquots of initiator in solvent are charged to the reaction. Typically, the initiator is charged to the reaction and followed by a hold period to allow for reaction to occur before adding the next initiator amount. Typically three initiator additions are used. After the final initiator amount is added the batch is held for 30 minutes to 4 hours to fully decompose all initiator and drive the reaction to completeness. An alternative method is to first charge both solvent and a portion of the monomer mixture to the reaction vessel.

The molecular weight of the (meth)acrylate polymers used in the invention typically have a weight average molecular weight of less than 250,000, although higher molecular weights may be employed. Preferably, the weight average molecular weight ranges from about 10,000 to about 250,000, and more preferably from about 20,000 to about 100,000. The binder polymers are typically used in an amount of from 45 to 90% wt, and preferably from 75 to 90% wt.

A wide variety of cross-linking agents may be used in the present invention. Such cross-linking agents are multi-functional monomers and in particular di-, tri-, tetra-, or higher multi-functional monomers. Preferably, such cross-linking agents are free-radically polymerizable, and more preferably di-, tri-, tetra-, or higher multi-functional ethylenically or acetylenically unsaturated monomers, and more preferably multifunctional (meth)acrylate monomers. Suitable cross-linking agents include, but are not limited to, divinyl benzene, allyl methacrylate; 1,4-benzenediol diacrylate; 1,4-benzenediol dimethacrylate; bis-(acryloxyethyl)phosphate; bisphenol-A diacrylate; bisphenol-A dimethacrylate; 1,3-butanediol diacrylate; 1,3-butanediol dimethacrylate; 1,4-butanediol diacrylate; 1,4-butanediol dimethacrylate; 2-butene-1,4-diol diacrylate; 2-butene-1,4-diol dimethacrylate; butylene glycol dimethacrylate; 1,2,4-butanetriol trimethacrylate; crotyl acrylate; crotyl methacrylate; 1,4-cyclohexanediol diacrylate; 1,4-cyclohexanediol dimethacrylate; decamethylene glycol diacrylate; decamethylene glycol dimethacrylate; diallyl isocyanurate; diallyl itaconate; diethylene glycol diacrylate; diethylene glycol dimethacrylate; di-(3-acryloxyethyl) ether of bisphenol-A; di-(acryloxy-2-hydroxypropyl) ether of bisphenol-A; diallyl fumarate; diisoprorenylbenzene; di-(3-methacryloxyethyl) ether of bisphenol-A; di-(3-methacryloxy-2-hydroxypropyl) ether of bisphenol-A; di-(3-methacryloxy-2-hydroxypropyl) ether of tetrachlorobisphenol-A; di-(3-methacryloxy-2-hydroxypropyl) ether of tetrabromobisphenol-A; di-(3-methacryloxy-2-hydroxypropyl) ether of 1,4-butanediol; di-(3-methacryloxy-2-hydroxypropyl) ether of diphenolic acid; 2,2-dimethyl-1,3-propanediol diacrylate; 2,2-dimethyl-1,3-propanediol dimethacrylate; dipropylene glycol dimethacrylate; ethylene glycol diacrylate; ethylene glycol dimethacrylate; gycerol triacrylate; gycerol trimethacrylate; hexamethylene glycol diacrylate; hexamethylene glycol dimethacrylate; hydrogenated bisphenol-A dimethacrylate; melamine acrylate; methallyl-ethacrylate; N,N'-methylenebisacrylamide; 1,9-nonanediol dimethacrylate; 1,5-pentanediol diacrylate; 1,5-pentanediol dimethacrylate; pentaerythritol tetraacrylate; pentaerythritol tetramethacrylate; pentaerythritol triacrylate; pentaerythritol trimethacrylate; 1-phenyl-1,2-ethanediol dimethacrylate; polyoxyethyl-2,2-di(p-hydroxyphenyl)propane diacrylate; polyoxyethyl-2,2-di(p-hydroxyphenyl)propane dimethacrylate; polyoxypropyltrimethylolpropane triacrylate; 1,3-propanediol diacrylate; 1,2-propanediol dimethacrylate; 1,3-propanediol dimethacrylate; propoxylated bisphenol-A dimethacrylate; tetraethylene glycol diacrylate; tetraethylene glycol dimethacrylate; 1,3,5-triacryloylhexahydro-s-trazine; triethylene glycol diacrylate; triethylene glycol dimethacrylate; 1,3,5-isopropenylbenzene; trimethylolethane triacrylate; trimethylolpropane diallyl ether mono-methacrylate; trimethylolpropane triacrylate; trimethylolpropane trimethacrylate; 2,2,4-trimethyl-1,3-pentanediol dimethacrylate; tripropylene glycol diacrylate; tris-(2-acryloxyethyl) isocyanurate; and tris-(2-methacryloxyethyl) isocyanurate. Also useful are the acrylate and methacrylate esters of polyalkoxylated compounds such as those described in U.S. Pat. Nos. 3,594,410, 4,180,474 and 4,382,135; polyoxyethylated trimethylolpropane triacrylate and trimethacrylate and similar compounds as disclosed in U.S. Pat. No. 3,380,831. Other suitable cross-linking agents are well-known to those skilled in the art.

Preferred cross-linking agents include ethyleneglycol diacrylate, trimethylolpropane triacrylate, allyl methacrylate ("ALMA"), ethyleneglycol dimethacrylate ("EGDMA"), diethyleneglycol dimethacrylate ("DEGDMA"), propyleneglycol dimethacrylate, propyleneglycol diacrylate, trimethylolpropane trimethacrylate ("TMPTMA"), glycidyl methacrylate, 2,2-dimethylpropane 1,3 diacrylate, 1,3-butylene glycol diacrylate, 1,3-butylene glycol dimethacrylate, 1,4-butanediol diacrylate, diethylene glycol diacrylate, diethylene glycol dimethacrylate, 1,6-hexanediol diacrylate, 1,6-hexanediol dimethacrylate, tripropylene glycol diacrylate, triethylene glycol dimethacrylate, tetraethylene glycol diacrylate, polyethylene glycol 200 diacrylate, tetraethylene glycol dimethacrylate, polyethylene glycol dimethacrylate, ethoxylated bisphenol A diacrylate, ethoxylated bisphenol A dimethacrylate, polyethylene glycol 600 dimethacrylate, poly(butanediol) diacrylate, pentaerythritol triacrylate, trimethylolpropane triethoxy triacrylate, glyceryl propoxy triacrylate, pentaerythritol tetraacrylate, pentaerythritol tetramethacrylate, dipentaerythritol monohydroxypentaacrylate, and mixtures thereof.

The amount of the cross-linking agent may vary over a wide range. In general, the amount of cross-linking agent is from 10 to 30% wt, and preferably from 15 to 25% wt.

Typically, the weight ratio of the (meth)acrylate polymer to the free-radically polymerizable cross-linking agent is from 1:1 to 10:1, preferably 1.5:1 to 9:1, and more preferably 3:1 to 7:1.

Any photoactive component that initiates or otherwise induces polymerization of the cross-linking agents may be employed in the present photosensitive compositions. It is preferred that the photoactive component is one that generates free-radicals, e.g. polymerization photoinitiators. Examples of photoactive components, include, but are not limited to, azo compounds, sulfur containing compounds, metallic salts and complexes, oximes, amines, polynuclear compounds, organic carbonyl compounds and mixtures thereof as described in U.S. Pat. No. 4,343,885, column 13, line 26 to column 17, line 18, the disclosure of which is incorporated by reference herein; and 9,10-anthraquinone; 1-chloroanthraquinone; 2-chloroanthraquinone; 2-methylanthraquinone; 2-ethylanthraquinone; 2-tert-butylanthraquinone; octamethylanthraquinone; 1,4-naphthoquinone; 9,10-phenanthrenequinone; 1,2-benzanthraquinone; 2,3-benzanthraquinone; 2-methyl-1,4-naphthoquinone; 2,3-dichloronaphthoquinone; 1,4-dimethylanthraquinone; 2,3-dimethylanthraquinone; 2-phenylanthraquinone; 2,3-diphenylanthraquinone; 3-chloro-2-methylanthraquinone; retenequinone; 7,8,9,10-tetrahydronaphthalenequinone; and 1,2,3,4-tetrahydrobenz(a)anthracene-7,12-dione. Other photoactive components which are also useful are described in U.S. Pat. No. 2,760,863 and include vicinal ketaldonyl alcohols, such as benzoin, pivaloin, acyloin ethers, e.g., benzoin methyl and ethyl ethers; alpha-hydrocarbon-substituted aromatic acyloins, including alpha-methylbenzoin, alpha-allylbenzoin, and alpha-phenylbenzoin. Photoreducible dyes and reducing agents disclosed in U.S. Pat. Nos. 2,850,445; 2,875,047; 3,097,096; 3,074,974; 3,097,097; and 3,145,104 as well as dyes of the phenazine, oxazine, and quinone classes; benzophenone, 2,4,5-triphenylimidazolyl dimers with hydrogen donors, and mixtures thereof as described in U.S. Pat. Nos. 3,427,161; 3,479,185; and 3,549,367 can be also used as photoinitiators. Also useful with photoinitiators and photoinhibitors are sensitizers as disclosed in U.S. Pat. No. 4,162,162. Though, not a free-radical generator, triphenylphosphine may be included in the photoactive chemical system as a catalyst. Such free-radical generators are particularly suitable for use with negative-acting photoimageable compositions. Other photoactive components, such as photoacid generators or photobase generators may suitably be used, particularly for positive-acting photosensitive compositions. Such photoacid and photobase generators are well-known to those skilled in the art.

Particularly suitable photoactive components include: 3-phenyl-5-isoxazolone/benzanthrone; 2-t-butylanthraquinone; 2,2-dimethoxy-2-phenylacetophenone; 1-hydroxycyclohexyl phenyl ketone, and diethoxyacetophenone. Other suitable photoinitiators are disclosed in Nippon Kagaku Kaisha No. 1192-199 (1984) and include 2,4,6,-tris(trichloromethyl)-1,3,5-triazine with 3,3'-carbonyl bis(7-diethylaminocoumarin), 1-methyl-2-benzylmethylene-1,2-dihydronaphthol (1,2d) thiazole, or 9-phenylacridine; 2-mecaptobenzimidazole with 9-phenylacridine; and 3-phenyl-5-isoxazoline with 9-fluorenone or 1-methyl-2-benzylmethylene-1,2-dihydronaphtho (1,2d) thiazole.

Preferred photoactive components are ketones having morpholino and s-phenyl groups, such as those disclosed U.S. Pat. No. 4,582,862 (Berner et al.), herein incorporated by reference. A preferred photoactive component is 2-methyl-1-[4-(methylthio)phenyl]-2-morpholinopropan-1-one.

Mixtures of photoactive components may optionally be used. When two photoactive components are used, they may be used in any ratio, such as from 99:1 to 1:99. Typically, such photoactive components are present in an amount of from 0.05 to 10% wt based on the total weight of the composition, preferably from 0.1 to 5% wt, and more preferably from 0.1 to 2% wt.

Any organic solvent that dissolves or suspends the binder polymer, the cross-linking agent and the photoactive component may be used in the present invention. Exemplary organic solvents include, but are not limited to: ketone solvents such as acetone, methyl ethyl ketone, cyclohexanone, methyl isoamyl ketone and 2-heptanone; polyhydric alcohols and derivatives thereof such as ethyleneglycol, ethyleneglycol monoacetate, diethyleneglycol, diethyleneglycol monoacetate, propyleneglycol, propyleneglycol monoacetate, dipropyleneglycol and dipropyleneglycol monoacetate as well as monomethyl, monoethyl, monopropyl, monobutyl and monophenyl ethers thereof, cyclic ether solvents such as dioxane; ester solvents such as methyl lactate, ethyl lactate, methyl acetate, ethyl acetate, butyl acetate, methyl pyruvate, ethyl pyruvate, methyl methoxypropionate and ethyl ethoxypropionate; and amide solvents such as N,N-dimethyl formamide, N,N-dimethyl acetamide, N-methyl-2-pyrrolidone, 3-ethoxyethyl propionate, 2-heptanone, γ-butyrolactone, and mixtures thereof.

The amount of solvent used in the present compositions is that amount necessary to provide compositions having a total solids content of 45% or greater. Other particularly useful compositions are those having a total solids content of $\geq 50\%$, $\geq 55\%$, $\geq 60\%$, and $\geq 65\%$.

A variety of optional additives may be used in the present compositions, including, but are not limited to: anti-striation agents, plasticizers, speed enhancers, fillers, dyes, film forming agents, and the like. Such optional additives will be present in various concentrations in a photoresist composition. For example, fillers and dyes may be used in relatively large concentrations, e.g. in amounts of from about 5 to 30 percent by weight, based on the total weight of the composition's dry components.

The photosensitive compositions of the present invention are typically prepared by combining the polymeric binder, cross-linking agent, photoactive component, solvent and optional additives in any order.

An advantage of the present photosensitive compositions is that they can be used to deposit a layer having a thickness of 50 μm or greater in a single-step coating process. Layers having thicknesses of $\geq 60$ μm, $\geq 65$ μm, $\geq 70$ μm, $\geq 75$ μm, $\geq 80$ μm, and $\geq 90$ μm can easily be deposited according to the present invention. In particular, photosensitive layers having a thickness of $\geq 100$ μm, e.g. up to 130 to 140 μm, can be achieved in a single-step coating process according to the present invention. Although a single-step process may be used, in certain instances it may be advantageous to use multiple coating steps to build up the desired thickness, such as $\geq 200$ μm. The present compositions may be used in such multiple-step coating processes.

The present process may be used to deposit a photosensitive composition on a variety of electronic device substrates, including, but not limited to, printed wiring boards, lead frames, semiconductor wafers, semiconductor packaging, and the like. The present process is particularly suitable for use in depositing metal bumps, such as solder bumps, on a semiconductor wafer.

In the present process, the photosensitive composition is disposed on an electronic device substrate by suitable method, such as, but not limited to, spin coating, dip coating, roller coating, screen printing, and the like. In a particular embodiment, the photosensitive composition is spin coated on a semiconductor wafer in a process of depositing metal bumps.

For purposes of illustration, the present invention will be described with respect to depositing a negative-acting photosensitive composition on a semiconductor wafer. In a first step of the process, an amount of the photosensitive composition is disposed on a semiconductor wafer. In one embodiment, the photosensitive composition is disposed on a conductive layer, particularly when the process is used to deposit metal bumps on a semiconductor wafer. The specific amount of the photosensitive composition depends upon the particular components of the photosensitive composition as well as the desired thickness of the resulting photosensitive layer. Typically, the photosensitive composition is disposed onto the center of the wafer, such wafer being either static or rotating. The wafer is then spun at a speed and for a time sufficient to provide a layer of the photosensitive composition having the desired thickness, the layer being substantially uniform in thickness across the wafer. Suitable spin spends are from 100 to 1500 rpm, but higher or lower spin speeds may be suitably employed. In one embodiment, the wafer is first spun at a speed of 100 to 700 rpm for a period of time, such as from 1 to 20 sec., and then spun at a second speed of 500 to 1000 rpm for a period of time, such as from 1 to 30 sec. The wafer may optionally be allowed to sit for a period of time prior to soft baking.

In a second step, the photosensitive composition is soft baked, i.e. heated to ensure solvent evaporation. Such soft baking is typically done by placing the wafer on a hot plate, e.g. 65° to 120° C., for a period of time, such as for 30 sec. to 5 minutes. As a third step, any topside edge bead is typically removed after the soft baking step. Any conventional edge bead removal process may be suitably employed. During such edge bead removal, the wafer is typically spun at a speed of $\leq 1000$ rpm and preferably $\leq 700$ rpm. The photosensitive composition is then hard baked, e.g. at 90° to 120° C. for 3 to 10 min., as a fourth step. After the hard baking step, the wafer is typically cooled.

Next, the photosensitive composition is imaged through a mask using actinic radiation of the appropriate wavelength for the photoactive component, such as 248 nm, 193 nm, 157 nm, EUV, e-beam, and the like to provide a relief image. Preferably, the photosensitive composition is imaged at 365 nm. A "mask" as used herein refers to a photomask or artwork used to provide the pattern to be imaged. In general, the present photosensitive compositions are exposed at an energy of 200 to 1800 mJ, and preferably from 800 to 1200 mJ.

Accordingly, the present invention provides a method for forming a relief image on a semiconductor wafer comprising the steps of: a) disposing on a semiconductor wafer a photosensitive composition comprising a binder polymer comprising as polymerized units one or more (meth)acrylate monomers; one or more free-radically polymerizable cross-linking agents; one or more photoactive components; and an organic solvent; wherein the photosensitive composition is substantially free of water and wherein the photosensitive composition has a total solids content of 45% or greater; b) spinning the semiconductor wafer at a speed and for a time sufficient to provide a layer of the photosensitive composition having a substantially uniform thickness, wherein the thickness of the layer is 50 μm or greater; and c) imagewise exposing the layer of photosensitive composition to actinic radiation.

Following exposure, the photosensitive composition is developed to provide the patterned image. A wide variety of developers may be used, such as solvent, aqueous alkaline compositions and aqueous acidic compositions. Preferably, an acidic composition, and more particularly an acidic aqueous composition, is used as the developer. In general, useful aqueous acidic developer compositions contain an acid and water. Such acids may be organic or inorganic, and are preferably organic. Suitable acids include, but are not limited to, lactic acid, propionic acid, citric acid, acetic acid, tartaric acid, glycolic acid, and the like. Mixtures of acids may be used. Typically, the acidic developers are used at a temperature of from room temperature to about 60° C. Preferably, such acidic developers are used at a temperature of 35° to 45° C.

In a process for depositing metal bumps on a semiconductor wafer, the layer of photosensitive composition is imaged so as to form apertures such as vias in the photosensitive layer. In such process, the photosensitive layer is disposed on a conductive layer on the electronic device. Exposure of the photosensitive composition and subsequent development provides defined holes (vias) in the photosensitive composition and exposes the underlying conductive layer. Accordingly, the next step of the process is to deposit metal or metal alloy bumps with the defined holes (vias). Such metal deposition may be by electroless or electrolytic deposition processes. Electrolytic metal deposition is preferred. In an electrolytic metal deposition process, the electronic device substrate, i.e. semiconductor wafer, functions as the cathode.

Prior to deposition of a metal or metal alloy, such as that suitable as a solder, a conductive layer such as copper or nickel may be deposited by sputtering, electroless deposition and the like, to form the under-bump-metal. Such under-bump-metal layer is typically from 1000 to 50,000 Å in thickness and acts as a wettable foundation to the subsequently plated solder bump.

A wide variety of metals may be deposited electrolessly, including, but not limited to, copper, tin-lead, nickel, gold, silver, palladium, and the like. Suitable metals and metal alloys that may be deposited electrolytically include, but are not limited to, copper, tin, tin-lead, nickel, gold, silver, tin-antimony, tin-copper, tin-bismuth, tin-indium, tin-silver, palladium, and the like. Such metal plating baths are well known to those skilled in the art and are readily available from a variety of sources, such as Shipley Company, Marlborough, Mass.

In one embodiment, the metal deposits on the semiconductor wafer are useful as solder bumps. Accordingly, it is preferred that the metal bumps are solderable metals and metal alloys, such as tin, tin-lead, tin-copper, tin-silver, tin-bismuth, tin-copper-bismuth, tin-copper-silver, and the like. Suitable metals and metal alloys for solder bump formation are disclosed in U.S. Pat. Nos. 5,186,383; 5,902, 472; 5,990,564; 6,099,713; and 6,013,572, as well as European Patent Application No. EP 1 148 548 (Cheung et al.), all of which are hereby incorporated by reference. Exemplary metals and metal alloys include, but are not limited to: tin; tin-copper alloy having less than 2% wt copper and preferably about 0.7% wt copper; a tin-silver alloy having less than 20% wt silver and preferably from 3.5 to 10% wt silver; a tin bismuth alloy having from 5 to 25 % wt bismuth and preferably about 20% wt bismuth; and a tin-silver-copper alloy having less than 5% wt silver and preferably about 3.5% wt silver, less than 2% wt copper and preferably about 0.7% wt copper, and the balance being tin. In one embodiment, the metal alloys used for solder bumps are lead-free, i.e. they contain ≦10 ppm of lead.

In general, suitable electrolytic metal plating baths are acidic and contain acid, water a soluble form of the metal or metals to be deposited and optionally one or more organic additives, such as brighteners (accelerators), carriers (suppressors), levelers, ductility enhancers, wetting agents, bath stabilizers (particularly for tin-containing baths), grain refiners and the like. The presence, type and amount of each optional component varies depending upon the particular metal plating bath used. Such metal plating baths are generally commercially available, such as from Shipley Company.

Binary alloys may be deposited from a single bath, as in the case of tin-copper, tin-bismuth, tin-silver, tin-lead and the like, or may be deposited as individual layers from multiple plating baths and reflowed to form and alloy. Such reflow technique is described in U.S. Pat. No. 6,013,572. Such reflow is typically performed after removal of the remaining photosensitive composition.

In such a process, the photosensitive composition functions as a protective layer to areas that are not to be plated. Following metal deposition, the remaining photosensitive composition is stripped, such as by using a commercially available N-methylpyrrolidone ("NMP") based stripper at a temperature of about 40° to 69° C. Suitable strippers are available from a variety of sources, such as Shipley-SVC, Sunnyvale, Calif.

Thus, the present invention also provides a method for forming metal bumps on a semiconductor wafer comprising the steps of: a) disposing on a semiconductor wafer a photosensitive composition comprising a binder polymer comprising as polymerized units one or more (meth)acrylate monomers; one or more free-radically polymerizable cross-linking agents; one or more photoactive components; and an organic solvent; wherein the photosensitive composition is substantially free of water and wherein the photosensitive composition has a total solids content of 45% or greater; b) spinning the semiconductor wafer at a speed and for a time sufficient to provide a layer of the photosensitive composition having a substantially uniform thickness, wherein the thickness of the layer is 50 μm or greater; c) imagewise exposing the layer of photosensitive composition to actinic radiation; d) developing the exposed layer of photosensitive composition to provide patterned areas; e) depositing a metal into the patterned areas; and f) removing the exposed photosensitive composition to provide a semiconductor wafer having metal bumps.

The following examples are presented to illustrate further various aspects of the present invention, but are not intended to limit the scope of the invention in any aspect.

EXAMPLE 1

A photosensitive composition was prepared by combining the components and in the amounts listed in the table. The total solids content of the composition was ≧60%.

| Component | Amount (% wt) |
|---|---|
| Copolymer of ethyl methacrylate, butyl acrylate and dimethylaminoethyl methacrylate in solvent | 80 |
| Dipentaerythritol monohydroxy pentaacrylate | 17 |

-continued

| Component | Amount (% wt) |
|---|---|
| 2-Methyl-1-[4-(methylthio)phenyl]-2-morpholinopropan-1-one | 2 |
| 2-Isopropylthioxanthone | 0.7 |
| Other additives | 0.3 |

EXAMPLE 2

The composition from Example 1 was spin coated on a semiconductor wafer as follows. The composition (6 mL) was dispensed onto the center of a static wafer and the wafer was spun for 5 sec. at 500 rpm to spread the composition across the wafer, followed by spinning at 700 rpm. Next, the edgebead was removed from the backside of the wafer, after which the wafer was allowed to relax for 60 sec. without spinning. The composition was then soft baked (3 min.) at 75° C. on a hot plate (off-contact). Following soft baking, the top side edgebead was removed by solvent contact for 30 sec. with the wafer spinning at 500 rpm. The composition was then hard baked on a hot plate at 100° C. (off-contact) for 30 sec. and then allowed to cool. The thickness of the composition on the wafer was approximately 100 μm.

EXAMPLE 3

The coated wafer from Example 2 was imaged at 365 nm through a mask. The imaged composition was then developed with lactic acid to provide a patterned photosensitive composition.

What is claimed is:

1. A method for depositing a photosensitive composition comprising the steps of:
    a) disposing on an electronic device substrate a photosensitive composition comprising a binder polymer comprising as polymerized units one or more (meth)acrylate monomers; one or more free-radically polymerizable cross-linking agents; one or more photoactive components; and an organic solvent; wherein the photosensitive composition is substantially free of water and wherein the photosensitive composition has a total solids content of 45% or greater;
    b) spinning the electronic device substrate at a speed and for a time sufficient to provide a layer of the photosensitive composition having a substantially uniform thickness, wherein the thickness of the layer is 50 μm or greater;
    c) imagewise exposing the layer of photosensitive composition to actinic radiation; and
    d) developing the exposed layer of photosensitive composition in an acidic developer composition.

2. The method of claim 1 wherein the one or more cross-linking agents are (meth)acrylate cross-linking agents.

3. The method of claim 1 wherein the total solids content is ≧50%.

4. The method of claim 1 wherein the binder polymer further comprises as polymerized units one or more amine-containing (meth)acrylate monomers.

5. The method of claim 1 wherein the binder polymer comprises as polymerized units one or more acid developable group-containing monomers.

6. The method of claim 1 wherein the binder polymer and the free-radically polymerizable cross-linking agent are present in a weight ratio of from 1:1 to 10:1.

7. A method for forming a relief image on a semiconductor wafer comprising the steps of:
- a) disposing on a semiconductor wafer a photosensitive composition comprising a binder polymer comprising as polymerized units one or more (meth)acrylate monomers; one or more free-radically polymerizable cross-linking agents; one or more photoactive components; and an organic solvent; wherein the photosensitive composition is substantially free of water and wherein the photosensitive composition has a total solids content of 45% or greater;
- b) spinning the semiconductor wafer at a speed and for a time sufficient to provide a layer of the photosensitive composition having a substantially uniform thickness, wherein the thickness of the layer is 50 μm or greater;
- c) imagewise exposing the layer of photosensitive composition to actinic radiation; and
- d) developing the exposed layer of photosensitive composition in an acidic developer composition.

8. The method of claim 7 wherein the one or more cross-linking agents are (meth)acrylate cross-linking agents.

9. The method of claim 7 wherein the total solids content is $\geq 50\%$.

10. The method of claim 7 wherein the binder polymer further comprises as polymerized units one or more amine-containing (meth)acrylate monomers.

11. The method of claim 7 wherein the binder polymer comprises as polymerized units one or more acid developable group-containing monomers.

12. The method of claim 7 wherein the binder polymer and the free-radically polymerizable cross-linking agent are present in a weight ratio of from 1:1 to 10:1.

13. A method for forming metal bumps on a semiconductor wafer comprising the steps of:
- a) disposing on a semiconductor wafer a photosensitive composition comprising a binder polymer comprising as polymerized units one or more (meth)acrylate monomers; one or more free-radically polymerizable cross-linking agents; one or more photoactive components; and an organic solvent; wherein the photosensitive composition is substantially free of water and wherein the photosensitive composition has a total solids content of 45% or greater;
- b) spinning the semiconductor wafer at a speed and for a time sufficient to provide a layer of the photosensitive composition having a substantially uniform thickness, wherein the thickness of the layer is 50 μm or greater;
- c) imagewise exposing the layer of photosensitive composition to actinic radiation;
- d) developing the exposed layer of photosensitive composition in an acidic developer composition to provide patterned areas;
- e) depositing a metal into the patterned areas; and
- f) removing the exposed photosensitive composition to provide a semiconductor wafer having metal bumps.

14. The method of claim 13 wherein the one or more cross-linking agents are (meth)acrylate cross-linking agents.

15. The method of claim 13 wherein the total solids content is $\geq 50\%$.

16. The method of claim 13 wherein the binder polymer further comprises as polymerized units one or more amine-containing (meth)acrylate monomers.

17. The method of claim 13 wherein the binder polymer comprises as polymerized units one or more acid developable group-containing monomers.

18. The method of claim 13 wherein the binder polymer and the free-radically polymerizable cross-linking agent are present in a weight ratio of from 1:1 to 10:1.

19. The method of claim 13 wherein the metal is deposited electrolytically.

20. A method for depositing a photosensitive composition comprising the steps of:
- a) disposing on an electronic device substrate a photosensitive composition comprising a binder polymer; one or more cross-linking agents; one or more photoactive components; and an organic solvent; wherein the photosensitive composition has an absorbance of $\leq 0.1$ absorbance units per micron at 365 nm; wherein the photosensitive composition is substantially free of water and wherein the photosensitive composition has a total solids content of 45% or greater; and
- b) spinning the electronic device substrate at a speed and for a time sufficient to provide a layer of the photosensitive composition having a substantially uniform thickness, wherein the thickness of the layer is 50 μm or greater;
- c) imagewise exposing the layer of photosensitive composition to actinic radiation; and
- d) developing the exposed layer of photosensitive composition in an acidic developer composition.

* * * * *